United States Patent [19]

Silber et al.

[11] Patent Number: 4,618,781
[45] Date of Patent: Oct. 21, 1986

[54] GATE TURN-OFF THYRISTOR CONSTRUCTION

[75] Inventors: Dieter Silber, Hausen; Friedhelm Sawitzki, Frankfurt am Main; Kurt Roy, Götzenhain, all of Fed. Rep. of Germany

[73] Assignee: Licentia Patent-Verwaltungs-G.m.b.H., Fed. Rep. of Germany

[21] Appl. No.: 246,019

[22] Filed: Mar. 20, 1981

Related U.S. Application Data

[63] Continuation of Ser. No. 46,935, Jun. 8, 1979, abandoned.

[30] Foreign Application Priority Data

Jun. 13, 1978 [DE] Fed. Rep. of Germany ....... 2825794

[51] Int. Cl.[4] ............................................. H03K 17/60
[52] U.S. Cl. ............................ 307/252 C; 307/252 M; 357/36; 357/38; 357/51
[58] Field of Search ..................... 357/38, 51, 36; 307/252 C, 252 M

[56] References Cited

U.S. PATENT DOCUMENTS

| 4,092,703 | 5/1978 | Sueoka et al. | 357/38 |
| 4,109,274 | 8/1978 | Belenkon et al. | 357/55 |
| 4,115,707 | 9/1978 | Kalfus | 307/252 C |
| 4,117,350 | 9/1978 | Kalfus et al. | 307/252 C |
| 4,117,351 | 9/1978 | Kalfus et al. | 307/252 C |
| 4,127,863 | 11/1978 | Kurata | 357/38 |
| 4,170,020 | 10/1979 | Sueoka et al. | 357/38 |
| 4,177,478 | 12/1979 | Senes | 357/38 |
| 4,221,980 | 9/1980 | Louw et al. | 307/252 C |
| 4,224,634 | 9/1980 | Svedberg | 307/252 C |
| 4,229,753 | 10/1980 | Bergeron et al. | 357/51 |

FOREIGN PATENT DOCUMENTS

| 2299727 | 8/1976 | France | 357/38 |
| 54-757 | 1/1979 | Japan | 357/38 |

Primary Examiner—Joseph E. Clawson, Jr.
Attorney, Agent, or Firm—McGlew and Tuttle

[57] ABSTRACT

A gate turn-off thyristor comprising, a first emitter layer of one conductivity type, a main base layer of another conductivity type connected to said first emitter layer and a control base layer of the first conductivity type connected to the main base layer. A second emitter of the other conductivity type is connected to the control base layer at a junction which surrounds a portion of the second emitter layer. An emitter contact is connected to the second emitter layer and a control base contact is connected to the control base layer. The gate turn-off thyristor is turned off by a short circuiting of the control base contact with the emitter contact. The surface resistance of the control base layer between the second emitter layer and the control base contact is selected so that, with a control base turn-off current applied which is sufficient for turning off the thyristor, a potential appears on a lateral resistance in the control base layer which is less than a potential appearing at the junction. This difference in potential is used as an additional driving potential for the hole or electron current flowing over the lateral resistance and the control base layer.

5 Claims, 8 Drawing Figures

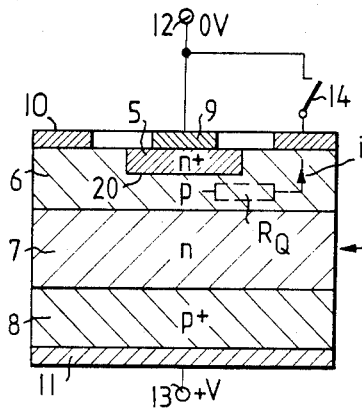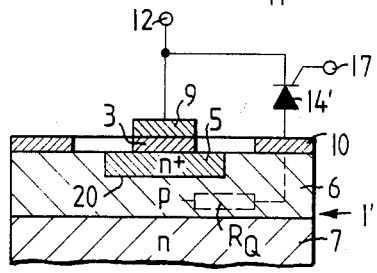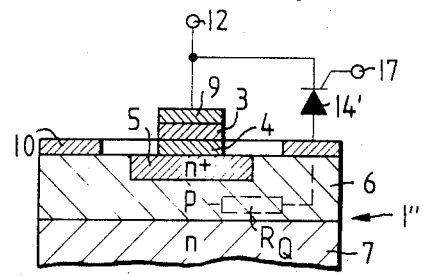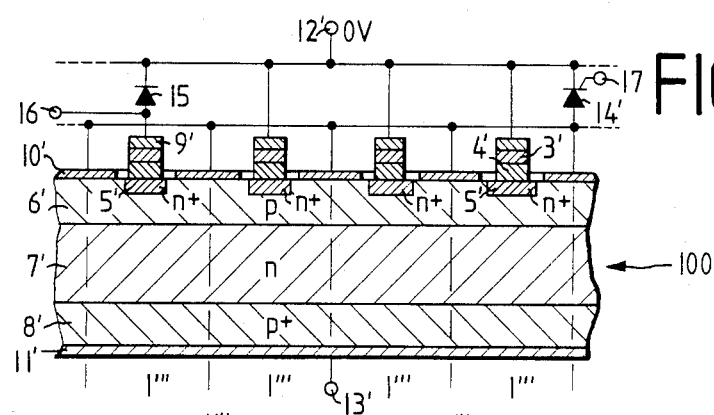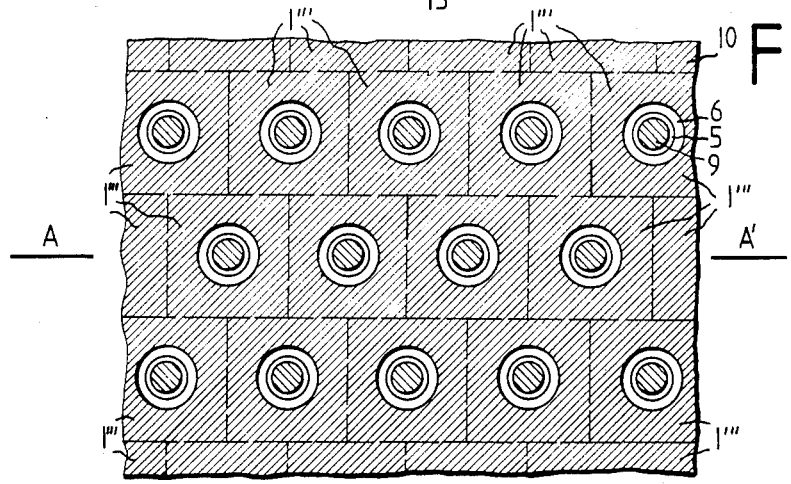

GATE TURN-OFF THYRISTOR CONSTRUCTION

This is a continuation of application Ser. No. 46,935 filed June 8, 1979, abandoned.

BACKGROUND OF THE INVENTION

1. Field of the Invention

The present invention relates to thyristors in general, and, in particular, to a new and useful gate turn-off thyristor comprising four layers of alternating conductivity type.

2. Description of the Prior Art

Thyristors with a p-doped control base layer are already known, which can be turned off by means of a negative control current flowing over the control base terminal (Semiconductor Power Converter International Conference Mar. 23–25, 1977 (IEEE), Orlando, Fla. "The current status of the power gate turn-off switch (GTO) p. 39–49). In order to positively turn off the tryristor, this control current must be about 20 to 30% of the load current to be turned off. Furthermore, a turn-off voltage is required which is between −10 V and −70 V. Turning off the thyristor requires thus a power circuit-fed control current generator with a load switch which requires considerable engineering costs.

A possibility of reducing these costs resides in increasing the turn-off gain (ratio of load current to turn-off current). Turn-off thyristors with a relatively large turn-off gain ($\geq 5$) cause, however, considerable on-state power losses, so that a high turn-off gain is foregone and the high engineering costs for the turn-off control are accepted.

A thyristor is already known which can be turned off by means of an integrated field effect transistor part, that bridges the cathode-emitter junction of the thyristor (DOS No. 26 25 917). But only relatively small currents can be conducted over this field effect transistor part, and only relatively small load currents can be turned off. The on-state behavior of the field effect transistor part is also very unfavorable.

SUMMARY OF THE INVENTION

The invention is a solution to the problem of providing a gate turn-off thyristor with up to very high turn-off currents and corresponding low turn-off gain, which requires low control power to be turned off.

The advantage achieved by the invention consists in that neither an external negative turn-off current nor an external negative turn-off voltage is required, hence no special energy source is needed for the turnoff operation. The load current of the thyristor can be turned off, for example, by means of another thyristor, which only has to meet low requirements regarding blocking capability and current carrying capacity. The control power of such a thyristor is low.

Accordingly, an object of the present invention is to provide a gate turn-off thyristor comprising, a first emitter layer of one conductivity type, a main base layer of another conductivity type connected to said first emitter layer, a control base layer of said one conductivity type connected to said main base layer, a second emitter of said other conductivity type connected to said control base layer at a junction therebetween which surrounds a portion of said second emitter layer, an emitter contact connected to said second emitter layer, and a control base contact connected to said control base layer at a location spaced from said emitter contact and said junction, said control base layer having a lateral resistance between an area thereof adjacent said junction and said control base contact, said gate turn-off thyristor being turned off by a short-circuiting of said control base contact with said emitter contact, the surface resistance of said control base layer between said second emitter layer and said control base contact being selected so that, with a control base turn-off current applied to said gate turn-off thyristor which is sufficient for turning off said thyristor, a potential appears on said lateral resistance which is less than that appearing at said junction whereby the difference between said potentials is used as an additional driving potential for a carrier current flowing over said lateral resistance and said control base contact.

A further object of the present invention is to provide a gate turn-off thyristor which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1a is a side elevational view of a gate turn-off thyristor in accordance with the invention;

FIG. 1b is a partial view similar to FIG. 1 of another embodiment of the invention;

FIG. 1c is a view similar to FIG. 1b of still another embodiment of the invention;

FIG. 2a is a side elevational view of another embodiment of the present invention taken along the lines A—A' of FIG. 2b;

FIG. 2b is a top plan view of the embodiment shown in FIG. 2a;

DESCRIPTION OF THE PREFERRED EMBODIMENTS

Figure 3:
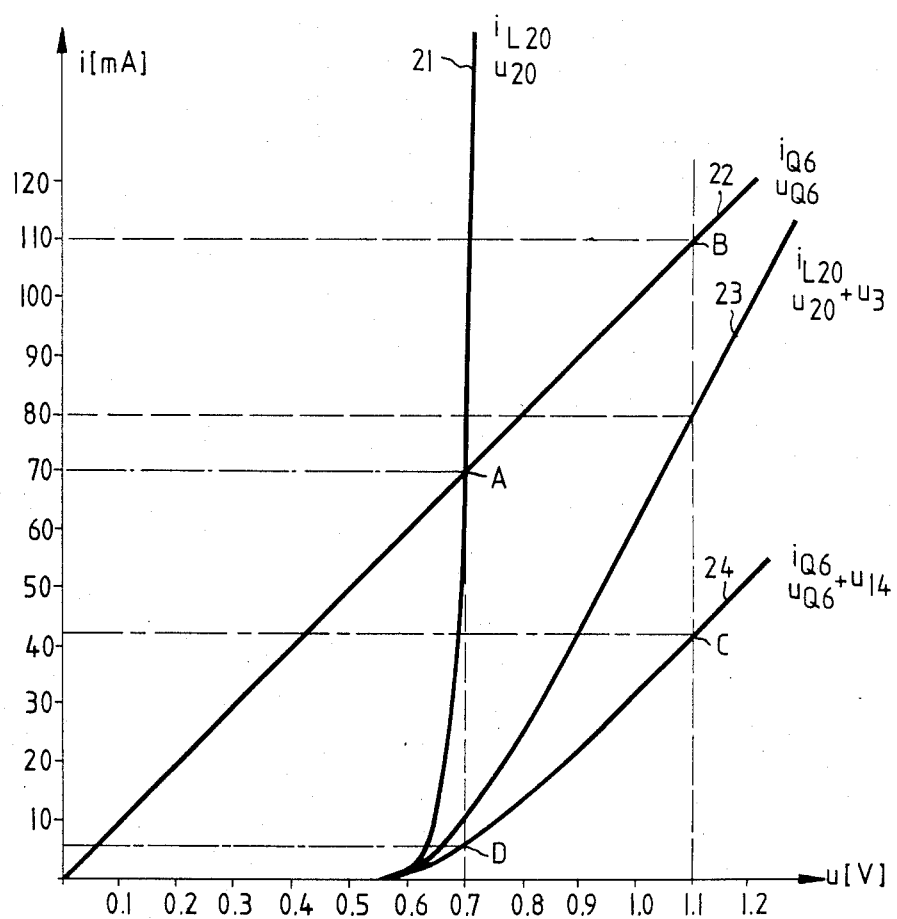
FIG. 3 is a graph of the dynamic characteristics of the inventive thyristor.

As shown in FIG. 1a, thyristor 1 comprises a p+ emitter layer 8, which is provided on its outer surface with a metallic contact 11 which has an anode terminal 13. The p+ emitter layer 8 is followed by a n-main base layer 7, which is followed by a p control base layer 6 into which is embedded an n+ emitter layer 5. On the outer surface of control base layer 6 is arranged a control base contact 10 surrounding the n+ emitter layer 5. The n+ emitter layer 5 is provided with a metallic contact 9. A switch 14 is arranged between the n+emitter contact 9 and the control base contact 10. In order to facilitate the understanding of the invention, a shunt resistor $R_Q$ is shown, which is traversed by a current iQ. 20 denotes the n+p junction of the layers 5, 6.

The thyristor according to FIG. 1a, can be turned off by simply short-circuiting a switch 14, which has practically zero resistance. In order to achieve this, shunt resistor $R_Q$ must be dimensioned according to the current required for turning off the thyristor.

According to FIG. 1b, a short circuit thyristor 14' can also be used for turning off the thyristor 1'. Since this element has no on-state voltage zero, an additional voltage is generated by means of ohmic resistor 3 arranged ahead of the n+emitter layer 5.

According to FIG. 1c, a structural element 4 with a non-linear characteristic can be used with the thyristor 1" between resistor 3 and contact 9.

In order to increase the power, a plurality of partial thyristors 1''' are combined according to FIGS. 2a and 2b, to form a gate turn-off thyristor 100 consisting of these partial thyristors which are operated in parallel.

Thyristor 100, according to FIG. 2a, comprises a p+ emitter layer 8' with a metal contact 11', which is provided with an anode contact 13'. The p+ emitter layer 8 is followed by an n-main base layer 7' which is followed by a p control base layer 6'. A plurality of n+emitter layers 5' are embedded in this layer 6' and are surrounded by a metal contact 10' arranged on the outer surface of the control base layer 6'.

On each n+ emitter layer 5' is arranged as ohmic resistor 3' and, if necessary, a structural element 4' with a non-linear characteristic.

The ohmic resistors 3' (and 3 in FIG. 1b or 1c) are formed, for example, by polysilicon-layers and the elements 4' (and 4 in FIG. 1c) by a highly doped p-epitaxy layer on the n+emitters 5', whose breakdown characteristic has the appropriate non-linear characteristic.

In FIGS. 1b, 1c and 2a, resistors 3 or 3' are each provided with an emitter contact 9 or 9' and these are connected in parallel and conducted to cathode contact 12 or 12'. Between contacts 9, 10 or 9', 10', is arranged the short circuit thyristor 14', which is fired over a terminal 17 in each case.

In FIG. 2a, thyristor 100 can be turned on over a single partial thyristor 1''' whose cathode contact 9' is conducted over a diode 15 to cathode terminal 12'. The firing is effected by means of a negative control current pulse fed to terminal 16. The firing of thyristor 100 can also be effected over control base contact 10'.

The mode of operation of the thyristors according to FIGS. 1a, 1b and 1c and 2a and 2b will now be described in connection with the diagrams according to FIG. 3.

When thyristor 1 of FIG. 1a is live or on, electrons are injected from n+ emitter 5, and holes are injected from p+ emitter 8, so that a carrier plasma is produced substantially in the range of n+ emitter 5, which effects the current conductions.

If the live thyristor 1 is to be turned off, care must be taken that so many holes arriving from p+ emitter 5 (holes) are removed over control base contact 10 so that there is no sufficient potential increase of control base layer 6 so that there is no injection of electrons from n+ emitter 5 and, consequently, no injection of holes.

In the current-carrying state of thyristor 1, control base layer 6 is biased positively relative to n+emitter 5 by about 0.5 to 0.7 V. If the transverse path of the holes to the control base contact 10 is made so small that the potential appearing on the effective shunt resistor $R_Q$ is less than the potential of the n+p junction 20, a driving voltage is already available for removing a load current portion over control base contact 10, which suffices to turn thyristor 1 off, if this load current portion is sufficiently great corresponding to the turn-off gain of the thyristor.

Figure 4:
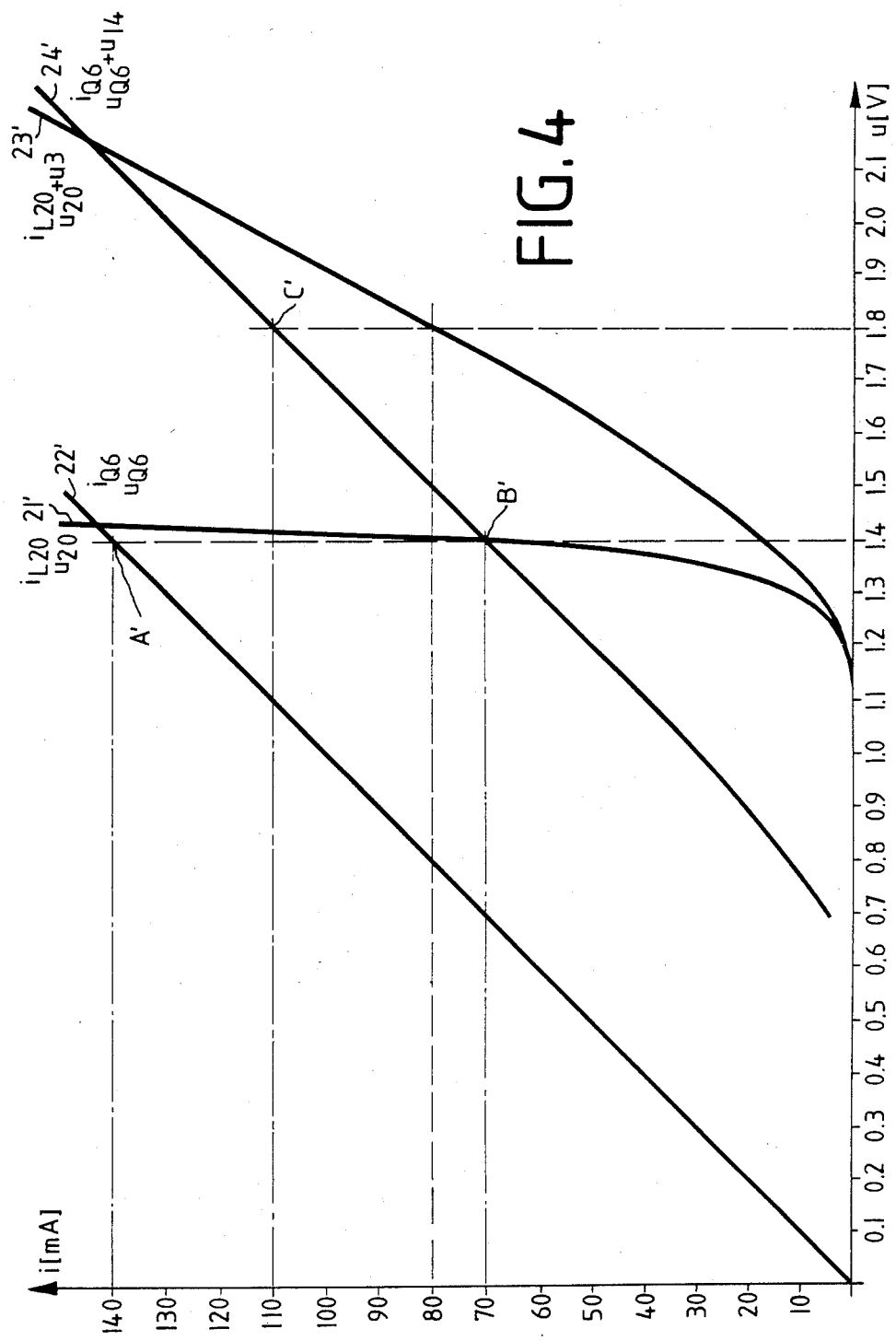
FIG. 4 is a graph of additional dynamic characteristics for the inventive thyristor.
Figure 5:
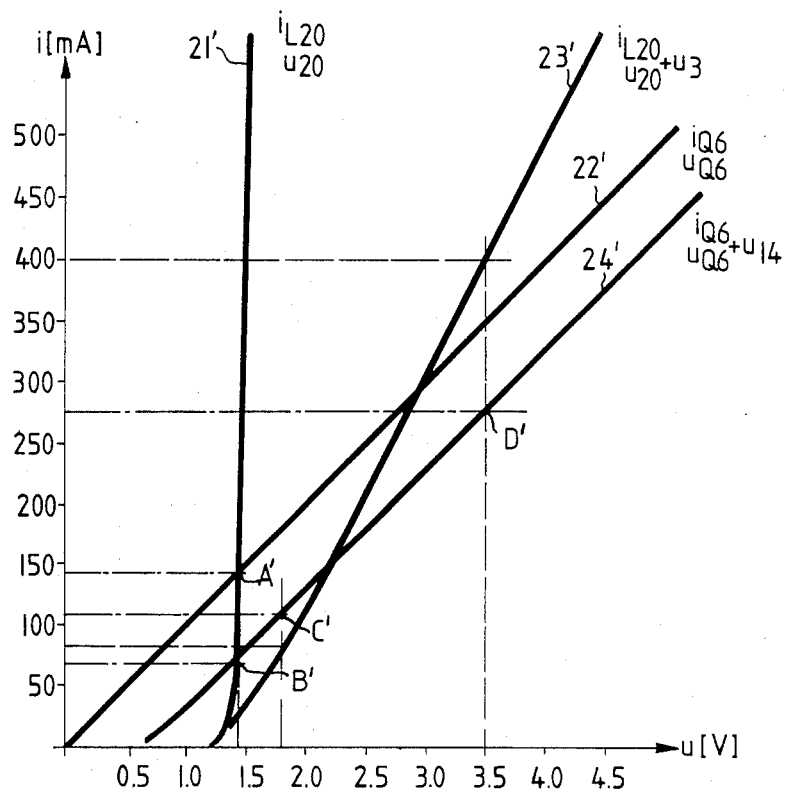
FIG. 5 shows the characteristic curves of FIG. 4 with extended scales.

FIGS. 3 to 5 show characteristics for a thyristor according to FIGS. 1a to 1c.

In FIG. 3, a load current $i_{L20}$ of 80 mA, for example, has been selected for thyristor 1 according to FIG. 1a and a voltage drop $u_{20}$ of 0.7 V, for example on p+n junction 20. The load current on-state voltage characteristic of the p+-n junction 20 is shown at curve 21. The shunt resistor $R_Q$ of thyristor 1 has a value of 10 ohms, for example, and is represented in the diagram by characteristic curve 22. The short circuit characteristic 22 intersects the 0.7 volt line at point A, and yields a transverse current iQ of about 70 mA, which forces the thyristor to be turned off.

The characteristic curve 23, results from the voltage drop at the n+p junction 20 and an additional voltage drop produced by the ohmic resistance 3 according to FIG. 1b. Resistance 3 is, for example, 5 ohms. With a load current $i_L$ of 80 mA, the voltage drop is 0.4 V, which is added to the 0.7 V, so that the total voltage is 1.1 V.

If the switch 14 is used for thyristor 1' according to FIG. 1b, it can be seen from the intersection B of the short circuit characteristic curve 22 with the 1.1 V line that a transverse current of about 110 mA would result.

If a short circuit thyristor 14' is used, we obtain the characteristic curve 24 from the effective shunt resistor $R_Q$ and the on-state behavior of thyristor 14', from whose intersection C with the 1.1 V line, it can be seen that a transverse current iQ of over 40 mA appears by which thyristor 1' is turned off.

If a short circuit thyristor 14' is used in thyristor 1', but no resistor 3, the characteristic 24 intersects the 0.7 V-line at point D. As seen, we obtain a transverse current iQ of about 5 mA, which is not sufficient to turn off thyristor 1'.

A thyristor 1 with a switch 14 according to FIG. 1a is limited by the attainable transverse current of about 70 mA regarding its turnoff with the appearance of excess currents. These should not exceed a value double that of the load current.

The characteristics 21' to 24' of the diagram according to FIG. 4, result when emitter 5 of thyristor 1" is preceded by only one element 4 with a non-linear characteristic, for example, a diode, or when emitter 5 is preceded both by a diode 4 and by a resistor 3, as indicated in FIG. 1c, The approximately exponential current-voltage characteristic of the diode is important. This can also be achieved, for example, by a reversely biased p+ n+ junction. As an example, a diode with an on-state voltage of 0.7 is used. The rated load current $i_{L20}$ of thyristor 1" is again 80 mA, and the driving voltage for the breaking current is 1.4 V.

If a switch 14, according to FIG. 1a, is used in a thyristor 1" with a preceding diode 4 for turning off the current, the short circuit characteristic 22' according to FIG. 4, intersects the 1.4 V-line at point A'. As seen, we obtain a transverse current of about 140 mA for turning off the thyristor, which is thus substantially greater than the load current iL.

If a short circuit thyristor 14' is used in the thyristor 1" with a preceding diode to turn off the current, we obtain the characteristic 24', which intersects the 1.4 V-line at point B'. A transverse current IQ of about 70 mA is formed, which turns off the thyristor 1" safely and rapidly.

If, in addition to diode 4, a resistor 3 is used, and if the short circuit element is a thyristor 14', as shown in FIG. 1c, we obtain the characteristic curve 23'. The driving voltage is then about 1.8 V. The short circuit characteristic 24' intersects the 1.8 V-line of point C' and yields a transverse current iQ of about 110 mA which is above the load current.

A thyristor 1″ with preceding resistor 3 and/or diode 4 and associated short circuit thyristor 14′ according to FIG. 1c, shows one excellent turn-off behavior even with current irregularities. This is represented in the diagram according to FIG. 5. It differs from the diagram according to FIG. 4 merely by the use of a greater current and voltage scale. The characteristics 21′ to 24′ are the same as in the diagram according to FIG. 4.

If an excess current 400 mA, for example, appears, as shown in the diagram according to FIG. 5, the short circuit characteristics 24′ intersects the 3.5 V-line at point D′ and a transverse current iQ of about 275 mA is obtained by which thyristor 1″ is turned off rapidly.

The specific surface resistance ρs of the p-control base layer 6 of thyristors 1, 1′, 1″ and 100 according to FIGS. 1a, 1b, 1c and FIGS. 2a and 2b is about 80 ohm/□ and their emitters have a diameter of about 200 μm. The inside diameter of the openings of the gate contact is about 250 μm.

The maximum voltage u-max, appearing between the center of the control base layer 6 in the contact opening or 6′ and the border of the gate metal contact 10 or 10′ is substantially proportional to the specific surface resistance ρs:

$$U_{max} = 1/4\pi \cdot J \cdot \rho s;$$

where J is the hole current and $1/4\pi$ is the geometric factor for a circular surface.

This yields $1/4\pi \cdot J \cdot 80$ ohm = J $\cdot 6.4$ ohm. This means that a shunt resistance $R_Q$ of about 6.4 ohm is assigned to the current flowing to the gate metal contact 10. For tolerance reasons, an auxiliary resistance in the p-base layer of 2 ohm, for example, is added. With a preceding resistance 3 of 5 ohm, a turn-off current of $> \frac{1}{3}$ of the total current is achieved, and thus a reliable turnoff of the thyristor. It is assumed that this thyristor has a turn-off gain of <3; with larger turnoff gain, correspondingly smaller branched-off load current portions are sufficient.

If a resistance of 5 ohm is used, and if the on-state voltage is to remain within certain limits, the current load must also remain low. With homogeneous current conductions, 0.4 V voltage drop are tolerable, so that we have:

$$J_{ohm} \cdot 5 \text{ ohm} \leq 0.4 \text{ V}$$

from which follows:

$$J_{ohm} = 0.4 \text{ V}/5 \text{ ohm} = 0.08 \text{ A}$$

With a current load of about 100 A/cm², this yields a surface of the n+ emitter 5:

$$F = 8 \cdot 10^{-2}/10^2 \cdot cm^2 = 0.08 \text{ mm}^2$$

which yields a maximum radius R of about 160 μm and a maximum diameter of 320 μm.

With higher load currents, a corresponding number of partial thyristors 1‴ according to FIGS. 2a and 2b, are connected in parallel, while maintaining the 5 ohm resistance 3′ for each partial thyristor 1‴. These resistances likewise effect a current homogenization. The parallel connection of the many resistances 3′ results in a very low total resistance, so that the on-state power losses of thyristor 100 remain low.

It should be understood that the inventive thyristor may be embodied with the areas of opposite conductivity type so that the emitter layer 8 generally speaking can be referred to as being of one conductivity type whereas the main base layer 7 may be referred to as being of another conductivity type and so on.

While three specific embodiments of the invention have been shown and described in detail to illustrate the application of the principles of the invention, it will be understood that the invention may be embodied otherwise without departing from such principles.

What is claimed is:

1. A gate turn-off thyristor with low control power consumption comprising:
   a first emitter layer (8) of one conductivity type;
   a main base layer (7) of another conductivity type connected to said first emitter layer;
   a control base layer (6) of said one conductivity type connected to said main base layer;
   a second emitter layer (5) of said other conductivity type connected to said control base layer at a junction (20) therebetween which surrounds a portion of said second emitter layer;
   a second emitter contact (9) connected to said second emitter layer;
   a control base contact (10) connected to said control base layer and having an opening with a geometric shape that has a center, said opening having a boundary surrounding and spaced from said second emitter contact and said junction;
   a first emitter contact (11) connected to said first emitter layer;
   biasing means (12,13) connected to said contacts for applying a turn-off current to said control base contact;
   said control base layer having a lateral shunt resistance ($R_Q$) between said junction (20) and said control base contact (10); and
   means (14,14′) for turning said turn-off thyristor off by a short circuiting of said control base contact (10) with said second emitter contact (9), connected between said control base and second emitter contacts;
   the surface resistance ($\rho_s$) of said control base layer (6) between said center and said control base contact boundary being selected so that, with a control base turn-off current which is sufficient for turning off the thyristor, a potential appears on said lateral shunt resistance ($R_Q$) which is less than that appearing at said junction (20) whereby the difference between said potentials is used as an additional driving potential for a carrier current flowing over said lateral resistance and said control base contact by said means for turning said gate turn-off thyristor off.

2. A gate turn-off thyristor according to claim 1, further including a plurality of spaced second emitters (5′), each having portions surrounded by said control base layer (6′) which is common for all of said second emitters and each forming a partial thyristor (1‴), each of said second emitters including a second emitter contact (9′), a resistor (3′) between each of said second emitter layers and a respective second emitter contact, whereby a branching of current supplied to said second emitter contacts is effected, each resistor having a value determined from the specific surface resistance ($\rho_s$) of the control base layer (6′) with homogeneous current guidance and from the turn-off gain, an area of the second emitters (5') of each partial thyristor (1''') being determined from a given on-state voltage for each partial thyristor and the partial on-state current resulting from the resistor (3') and this on-state voltage and the admissible current load of the partial element.

3. A gate turn-off thyristor according to claim 2, wherein each resistor, said specific surface resistance of the control base layer, and a surface of each partial thyristor are dimensioned so that a voltage drop across the junctions (20) and each resistor form the on-stage voltage for said means for turning said gate turn-off thrystor off.

4. A gate turn-off thyristor according to claim 1, wherein said means for turning said gate turn-off thyristor off comprise a short circuting switch (14) connected between said control base contact and said second emitter contact.

5. A gate turn-off thyristor according to claim 1, wherein said short circuiting means comprises a second thyristor (14') connected between said control base contact and said second emitter contact and a resistor layer (3) connected between said second emitter contact and said second emitter layer, said biasing means including a second control gate terminal connected to said second thyristor for controlling said second thyristor.

* * * * *